United States Patent [19]

Gershenson et al.

[11] Patent Number: 4,663,590
[45] Date of Patent: May 5, 1987

[54] SINGLE FREQUENCY NOISE REDUCTION CIRCUIT FOR SQUIDS

[75] Inventors: Meir Gershenson, St. Paul; Dale J. Fixsen, St. Louis Park, both of Minn.

[73] Assignee: Sperry Corporation, Blue Bell, Pa.

[21] Appl. No.: 784,123

[22] Filed: Nov. 6, 1985

[51] Int. Cl.⁴ .......................................... G01R 33/035
[52] U.S. Cl. ..................................... 324/248; 307/306
[58] Field of Search ............... 324/244, 248, 311, 314, 324/79 R, 79 D; 307/306, 512; 328/166; 335/216; 455/109

[56] References Cited

U.S. PATENT DOCUMENTS

| | | | |
|---|---|---|---|
| 3,221,273 | 11/1965 | Livingston | 455/109 X |
| 3,450,899 | 6/1969 | Knight | 328/166 X |
| 3,725,819 | 4/1973 | Fulton | 324/248 X |
| 4,389,612 | 6/1983 | Simmonds et al. | 324/248 |
| 4,585,999 | 4/1986 | Hilbert et al. | 324/248 X |

OTHER PUBLICATIONS

Yamashita et al., "RF-SQUID Magnetometer Biased by Harmonic", J. Appl. Phys., Jul. 1979, pp. 4503–4508.

Primary Examiner—Reinhard J. Eisenzopf
Assistant Examiner—Warren S. Edmonds
Attorney, Agent, or Firm—Glenn W. Bowen

[57] ABSTRACT

A two-junction DC SQUID is supplied a single square-wave frequency signal that both biases the SQUID and provides modulation with a square-wave train that is 90° phase displaced with respect to the bias square-wave train in order to eliminate low frequency noise with cross-modulation frequency products.

4 Claims, 2 Drawing Figures

SINGLE FREQUENCY NOISE REDUCTION CIRCUIT FOR SQUIDS

FIELD OF THE INVENTION

This invention relates to Superconducting Quantum Interference Devices (SQUIDS) in general and more particularly to a circuit which employs a single square-wave frequency for both modulating the input signal applied to the SQUID and biasing of the SQUID to reduce low frequency noise.

BACKGROUND OF THE INVENTION

Superconducting rings which contain a pair of Josephson junctions and utilize quantum interference phenomenon in the measurement of magnetic fields are known. Josephson pair SQUIDS are now being constructed with thin film junctions which are as small as one micron and are separated by semiconductor or oxide insulation layers. This provides a device with high sensitivity, but also one which is subject to a high level of thermodynamically induced low frequency noise in the superconducting thin film materials. The smaller the volume of superconducting material, the greater the amount of the thermodynamic temperature fluctuations at the junction area. The effect of such fluctuations is to produce corresponding fluctuations in the operating resistance of the junction area.

The first attempts at eliminating this low frequency thermodynamically generated noise was to provide a constant DC bias current in the loop. Since the two Josephson junctions are symmetrical, the DC bias current provided a bias flux which biased the quiescent output voltage from the two junctions in opposite directions. The sensed magnetic flux was then used to amplitude modulate a modulating signal which was coupled by means of a feedback coil to the SQUID loop. The modulating signal at the two Josephson junctions, thus produced oscillatory signals which were imposed upon the steady state signal produced by the bias current and were 180 degrees out of phase.

The basic SQUID device with a constant DC bias current proved to be inadequate for many applications. In order to overcome this low frequency noise which had a 1/f energy spectral density due to fluctuations at the two junctions, the circuit which was described in U.S. Pat. No. 4,389,612, issued June 21, 1983 to Michael B. Simmonds, et al, was directed to the use of a square-wave bias signal that was switched at a repetition rate that was different from the frequency of the modulating signal. According to the Simmonds patent the switching frequency of the square-wave bias signal resulted in differential noise currents due to thermo-fluctuations being reversed in phase. The fluctuation noise was not mixed or heterodyned by the switching of the bias current, but the sensed flux changes were heterodyned and appeared as side bands around the switching frequency and its harmonics. A modulating AC signal was also employed to demodulate the resulting output signal to recover the original input signal.

While the circuit of the Simmonds, et al patent was an improvement in eliminating low frequency noise in multijunction SQUIDS the employment of square-wave bias switching at one frequency and modulation at another frequency in itself generated additional and undesired noise components due to cross modulation frequency products from the two different frequencies employed. The present invention is directed to a circuit in which low frequency thermodynamic fluctuation noise is avoided without the production of this cross-modulation noise. In the present invention this is accomplished by use of a signal frequency both for switching the square-wave bias signal and for modulating the input, wherein a phase shift of approximately 90° is maintained between the switching frequency and the modulation signal.

SUMMARY OF THE INVENTION

The present invention is directed to a circuit which employs a single frequency that both modulates the input of a dc SQUID and provides a switched square-wave bias current through the device in order to remove substantially all of the low frequency thermodynamically generated noise from the output signal. The switching frequency is much greater than any frequency of which the 1/f noise is appreciable, and is far above any signal frequencies. The switching signal and the AC modulating signal are maintained at a 90° phase shift. In the disclosed embodiment the switching frequency, the modulation signal and the demodulation of the process signal ar all achieved by the use of chopping circuits.

BRIEF DESCRIPTION OF THE DRAWINGS

The present invention is described by reference to the drawings in which.

DETAILED DESCRIPTION OF THE INVENTION

Figure 1:
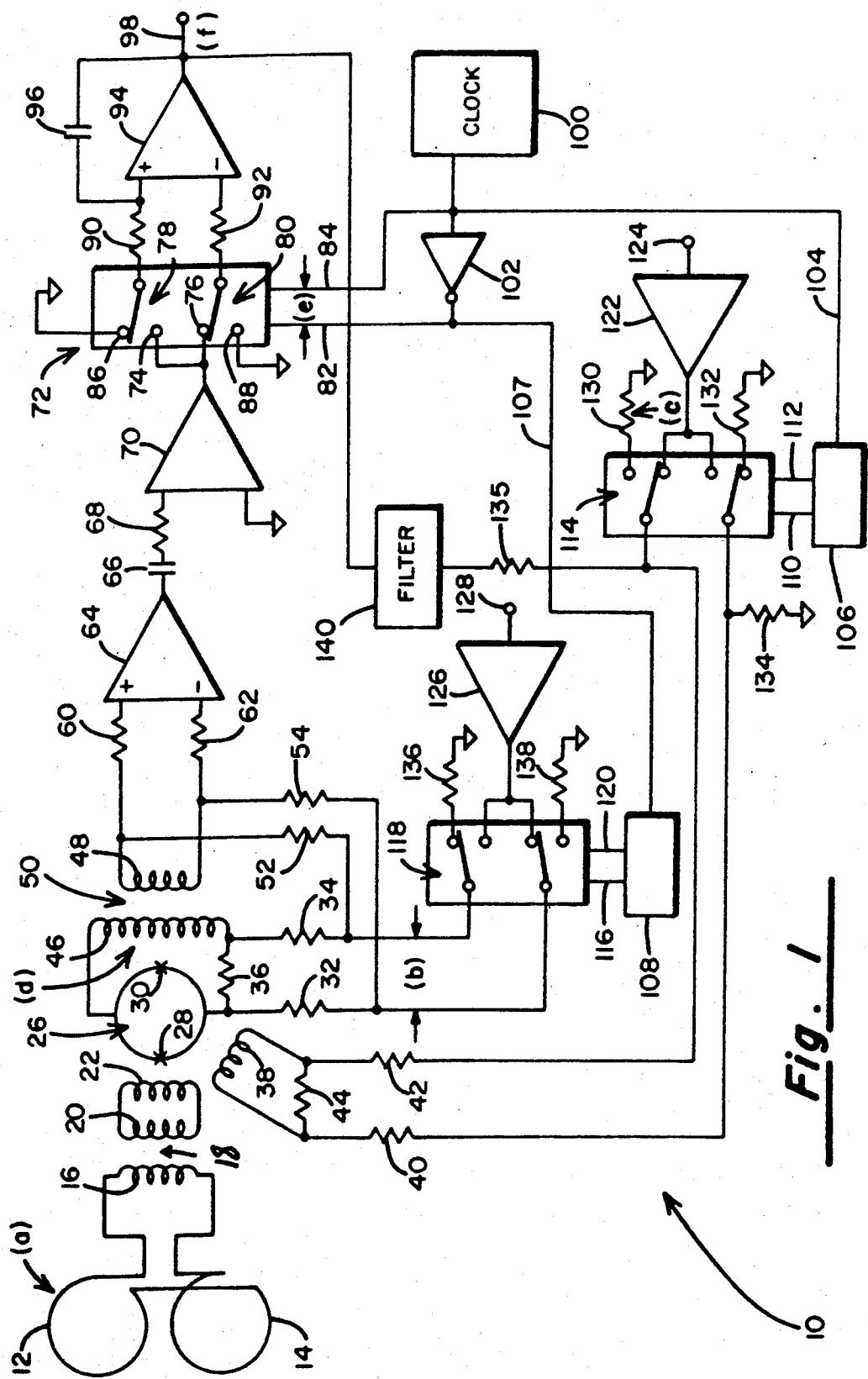
FIG. 1 shows a schematic of an embodiment of the present invention.

The circuit 10 which illustrates the present invention in the figure is implemented as a magnetic gradiometer which employs a pair of magnetic sensing loops 12, 14 which are oppositely wound so that a differential signal will be detected. The circuit may also be implemented with a single loop to form a magnetometer. The loops 12 and 14 are coupled to the primary winding 16 of an isolation transformer 18. The signal from the secondary winding 20 is coupled through the winding 22 to the Superconducting Quantum Interference Device or SQUID 26 which is formed with the junctions 28 and 30.

A switched square-wave bias signal is coupled to the SQUID 26 through the resistors 32, 34, and 36. A modulating signal at the same frequency as the square-wave biasing signal (b) supplies square-waves to the modulation and feedback transformer loop 38 wherein the modulation and feedback signal is developed across the resistors 40, 42 and 44. The input signal from the loops 12 and 14 is coupled through the isolation transformer 18 into the loop 26 so that this signal is mixed, or heterodyned, with the bias signal and the modulation signal that are supplied to the loop. The bias signal and modulation signal are both square-wave signals of the same frequency but are displaced 90° in phase. The development of these signals will be described in more detail subsequently.

The total signal including input components from the loops 12, 14, bias components supplied through the resistors 32, 34 and 36 and modulation and feedback components supplied through the modulation and feedback winding 38, is coupled through the primary winding 46 to the secondary winding 48 of the coupling transformer 50. The switched frequency bias square-wave is coupled through the resistors 52, 54 to opposite sides of the secondary winding 48 so as to cancel the effects of the square-wave switching voltages in the output signal. The signal path is then through the input resistors 60, 62 to the inputs of a differential amplifier 64 which serves to amplify the signal.

The output of the amplifier 64 is coupled through the coupling capacitor 66 and the input resistor 68 to an amplifier 70. The output of the amplifier 70 is coupled to a demodulating chopper 72 which is controlled so as to demodulate or remove the signal conponents created by switching of the modulating square-wave through the winding 38 and the bias square-wave. The chopping frequency of the chopper 72 is twice the chopping frequency of the bias square-wave and the modulating square-waves supplied to the SQUID.

Figure 2:
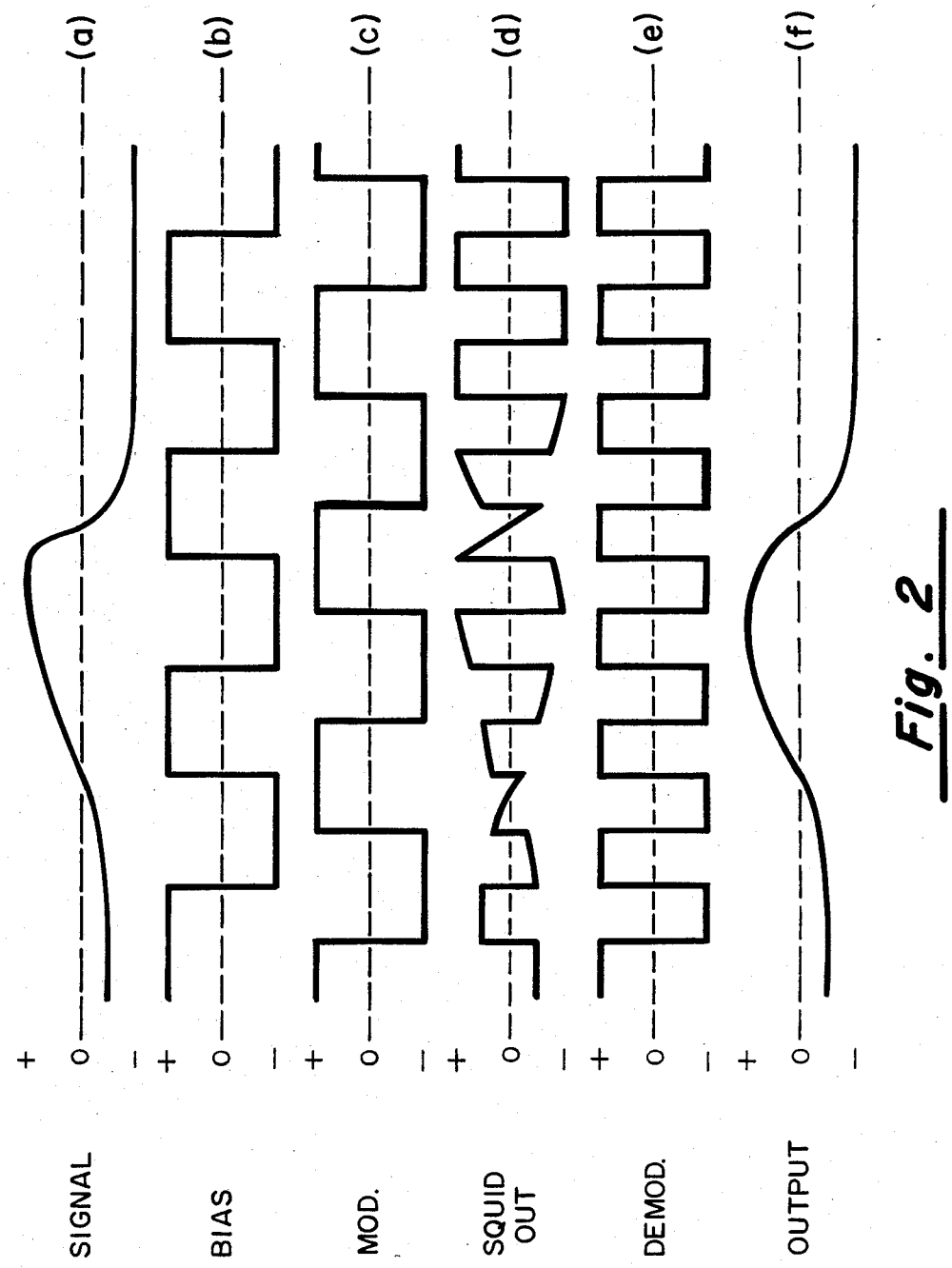
FIG. 2 shows waveforms developed at various points of the circuit of FIG. 1.

FIG. 2 shows the relationship of the input signal, bias, modulation, SQUID output, demodulation and output signals at points a, b, c, d, e and f, respectively. As seen from this figure, the modulating square-wave changes from one level to another level at a point which is midway during the duration of one half of a bias square-wave. The demodulating square-waves thus change levels each time either the bias or the modulating wave changes a level.

The signal passed through the amplifier 70 is applied to a pair of terminals 74, 76 which are both connected to the output of the amplifier 70. The chopper consists of a pair of alternating switches 78, 80 which change state in response to "on" and "off" signals on the control lines 82, 84 respectively. When a high signal is present on the lines 82, 84 a low signal will be present on the other of these lines. The state of the switches 78, 80 will thus be in one state as for example as shown in the figure wherein the upper switch is connected to the grounded terminal 86 and the lower switch 80 is connected to the input terminal 76. When the other line of the pair is at a high level, the switch 78 will be connected to the terminal 74 and the switch 80 will be connected to the grounded terminal 88.

In this manner an alternating polarity signal will be supplied through the input resistors 90, 92 to the inputs of a differential amplifier 94 which has a feedback capacitor 96 coupled so that the amplifier 94 operates as an operational integrating amplifier.

The origin of the square-waves for the choppers is the square-wave clock source 100 which is coupled directly to the line 84 and through the inverter 102 to the line 82. Thus the demodulating signal shown in FIG. 2 is identical to the output of the clock circuit 100. The signal on the line 84 is also supplied on the line 104 to a divide counter stage 106 while the signal on the line 82 is supplied on line 107 to another divide counter stage 108. The divide counters 106 and 108 divide the signals on the lines 104 amd 106 by two. The square-wave signal on the line 110, therefore, serves to switch the chopper 114 from one state to another when it is at a high level and the chopper will remain at that state until the second clock pulse from the clock 100 is fed into the counter 106 on the line 104 at which time the line 112 will go high, thereby turning the chopper off.

In a similar manner the output on the line 116 from the counter 108 will go on a high level and the inverted clock output signal to the inverter goes to a high level. Correspondingly the chopper 118 will remain at its switched state until the second inverted clock signal is received by the counter 108 at which time the line 120 will go to a high level, which switches the chopper 118 to its opposite state. The voltage levels for the chopper 114 and 118 are obtained through the amplifiers 112, which is connected to the voltage reference terminal 124, and the amplifier 126 which is connected to the voltage reference terminal 128. The resistors 130, 132, 134, and 135 are used to develop the voltage signals required in conjunction with the chopper 114. The resistors 136 and 138 develop the voltrage signals for the chopper 118.

Since the control signals on the lines 104 and 107 respectively are 180 degrees out of phase they are supplied to a divide by two counters 106 and 108. The output of the square-waves that are supplied from the chopper 118 for the purpose of supplying the square-wave bias switching frequency, and from the chopper 114 for the purpose of supplying the square-wave modulating switching frequency, will be approximately 90° as shown in FIG. 2. The feedback signal from the output 98 is supplied through a filter which is used to eliminate chopping noise and any harmonics that result from the switching of the square-wave.

What is claimed is:

1. A dc SQUID circuit having a pair of Josephson junctions connected in a superconductive loop, comprising means for applying a bias current through the pair of junctions in parallel forming said loop via square-waves, means for producing bias current square-waves periodically at a frequency, modulation means for producing modulation square-waves that produce flux which links the loop at said same square-wave frequency wherein said modulation and said bias current square-waves are approximately 90° phase displaced and means coupled across said junctions in parallel for generating an output signal that varies in magnitude in response to changes in the voltage across said two junctions in parallel due to changes in the level of flux linking the loop.

2. A dc SQUID circuit as claimed in claim 1 wherein said modulation and bias square-waves are produced by modulation and bias chopper means.

3. A dc SQUID circuit as claimed in claim 1 further comprising demodulation means which produces demodulation square-waves that change levels upon the level change of either a modulation of a bias square-wave.

4. A dc SQUID circuit as claimed in claim 3 wherein said demodulation square-waves are produced by demodulation chopper means which operate at twice the square-wave frequency of said modulation and said bias chopper means.

* * * * *